(12) United States Patent
Usami

(10) Patent No.: US 7,674,721 B2
(45) Date of Patent: Mar. 9, 2010

(54) SEMICONDUCTOR DEVICE, SEMICONDUCTOR WAFER, AND METHODS OF PRODUCING SAME DEVICE AND WAFER

(75) Inventor: Tatsuya Usami, Tokyo (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 73 days.

(21) Appl. No.: 11/797,293

(22) Filed: May 2, 2007

(65) Prior Publication Data

US 2007/0207610 A1    Sep. 6, 2007

Related U.S. Application Data

(62) Division of application No. 10/135,393, filed on May 1, 2002, now Pat. No. 7,229,910, which is a division of application No. 09/851,313, filed on May 9, 2001, now Pat. No. 7,602,048.

(30) Foreign Application Priority Data

May 16, 2000    (JP)    ............................. 2000-143725

(51) Int. Cl.
*H01L 21/316*    (2006.01)
(52) U.S. Cl. .................. 438/763; 438/788; 438/789; 438/790; 257/E21.575
(58) Field of Classification Search .......... 438/761, 438/763, 778, 780, 787–790, 913, 935, 970; 257/E21.575
See application file for complete search history.

(56) References Cited

U.S. PATENT DOCUMENTS

| | | | |
|---|---|---|---|
| 4,382,057 | A | 5/1983 | Tolentino |
| 5,672,660 | A | 9/1997 | Medsker et al. |
| 5,818,111 | A | 10/1998 | Jeng et al. |
| 6,001,747 | A * | 12/1999 | Annapragada ............. 438/790 |

(Continued)

FOREIGN PATENT DOCUMENTS

JP        10-144670        5/1998

(Continued)

OTHER PUBLICATIONS

Wen-Chang Chen, et al., Effect of Slurry Formulations on Chemical-Mechanical Polishing of Low Dielectric Constant Polysioxanes: Hydrid-Organo Siloxane and Methyl Silsesquioxane, Jan./Feb. 2000, J. Vac. Sci. Techno. B 18(1), 201-207.

(Continued)

*Primary Examiner*—Douglas M Menz
*Assistant Examiner*—Matthew W Such
(74) *Attorney, Agent, or Firm*—McGinn IP Law Group, PLLC

(57) ABSTRACT

A method of forming a multi-layered insulation film includes forming a first insulation layer using a first feed gas, the first insulation layer including methyl silsesquioxane (MSQ), forming a second insulation layer using a second feed gas, the second insulation layer including a polysiloxane compound having an Si—H group such that the second insulation layer is in contact with a top of the first insulation layer, and forming a third insulation layer including an inorganic material such that the third insulation layer is in contact with a top of the second insulation layer.

18 Claims, 10 Drawing Sheets

U.S. PATENT DOCUMENTS

| | | | |
|---|---|---|---|
| 6,008,540 | A | 12/1999 | Lu et al. |
| 6,051,508 | A | 4/2000 | Takase et al. |
| 6,054,379 | A * | 4/2000 | Yau et al. ............... 438/623 |
| 6,054,769 | A | 4/2000 | Jeng |
| 6,072,227 | A | 6/2000 | Yau et al. |
| 6,080,526 | A | 6/2000 | Yang et al. |
| 6,124,641 | A * | 9/2000 | Matsuura ............... 257/759 |
| 6,168,726 | B1 | 1/2001 | Li et al. |
| 6,191,028 | B1 | 2/2001 | Huang et al. |
| 6,197,703 | B1 | 3/2001 | You et al. |
| 6,218,317 | B1 | 4/2001 | Allada et al. |
| 6,248,704 | B1 | 6/2001 | Small et al. |
| 6,265,780 | B1 | 7/2001 | Yew et al. |
| 6,274,497 | B1 | 8/2001 | Lou |
| 6,277,732 | B1 | 8/2001 | Lou |
| 6,284,675 | B1 | 9/2001 | Jin et al. |
| 6,303,192 | B1 | 10/2001 | Annapragada et al. |
| 6,323,121 | B1 | 11/2001 | Liu et al. |
| 6,326,692 | B1 | 12/2001 | Pangrie et al. |
| 6,333,257 | B1 | 12/2001 | Aoi |
| 6,383,951 | B1 | 5/2002 | Li |
| 6,403,464 | B1 | 6/2002 | Chang |
| 6,403,471 | B1 | 6/2002 | Lou |
| 6,407,011 | B1 | 6/2002 | Ikeda et al. |
| 6,423,652 | B1 | 7/2002 | Chang et al. |
| 6,426,249 | B1 | 7/2002 | Geffken et al. |
| 6,429,147 | B2 * | 8/2002 | Hara .................. 438/763 |
| 6,448,186 | B1 * | 9/2002 | Olson et al. ............... 438/758 |
| 6,448,655 | B1 | 9/2002 | Babich et al. |
| 6,452,274 | B1 | 9/2002 | Hasegawa et al. |
| 6,465,361 | B1 | 10/2002 | You et al. |
| 6,476,132 | B1 | 11/2002 | Abdou-Sabet et al. |
| 6,485,815 | B1 | 11/2002 | Jeong et al. |
| 6,503,818 | B1 | 1/2003 | Jang |
| 6,511,909 | B1 | 1/2003 | Yau et al. |
| 6,624,061 | B2 | 9/2003 | Aoki |
| 6,627,539 | B1 | 9/2003 | Zhao et al. |
| 6,800,928 | B1 | 10/2004 | Lee et al. |
| 6,812,131 | B1 | 11/2004 | Kennedy et al. |
| 6,869,896 | B2 | 3/2005 | Cheung et al. |
| 2001/0005546 | A1 * | 6/2001 | Cheung et al. ............... 428/210 |
| 2002/0137359 | A1 * | 9/2002 | Grill et al. ............... 438/778 |
| 2002/0140101 | A1 | 10/2002 | Yang et al. |
| 2005/0233591 | A1 | 10/2005 | Schmitt et al. |

FOREIGN PATENT DOCUMENTS

| | | |
|---|---|---|
| JP | 10-144672 | 5/1998 |
| JP | 10-326829 | 12/1998 |
| JP | 11-87342 | 3/1999 |
| JP | 11-97533 | 4/1999 |
| JP | 10-209148 | 8/1999 |
| JP | 2000-058536 | 2/2000 |
| JP | 2000-058641 | 2/2000 |
| JP | 2001-044191 | 2/2001 |

OTHER PUBLICATIONS

Sun-Young Kim, et al., HOSP as a Low Dielectric Material: Comparative Study Against Hydrogen Silesesquioxane, 1999 IEEE, 218-221.

Japanese Office Action dated Jul. 23, 2008 with a partial English translation.

* cited by examiner (a)

(b)

(a)

(b)

(c)

(a)

(b)

(a)

(b)

(a)

(b)

(c)

(a)

(b)

SEMICONDUCTOR DEVICE, SEMICONDUCTOR WAFER, AND METHODS OF PRODUCING SAME DEVICE AND WAFER

The present Application is a Divisional Application of U.S. patent application Ser. No. 10/135,393, filed on May 1, 2002 now U.S. Pat. No. 7,229,910, which was a Divisional Application of U.S. patent application Ser. No. 09/851,313, filed on May 9, 2001 now U.S. Pat. No. 7,602,048.

BACKGROUND OF THE INVENTION (1) Field of the Invention

The present invention relates to a semiconductor wafer on which a film with low dielectric constant is formed, semiconductor device with wires or the like in the above film with low dielectric constant, and methods of producing the same wafer and device.

(2) Description of the Prior Art

Recently, techniques for utilizing materials of low dielectric constant, which can decrease inter-wire capacity, have been extensively developed to cope with higher-speed operation of devices.

A process for forming a damascene copper wiring system of low dielectric constant material is described by referring to FIGS. 6 and 7.

Referring to FIG. 6(a), the silicon nitride film 1 is formed on the lower wiring layer on the silicon substrate (both not shown), and then is coated with the Methyl Silsesquioxane (MSQ) film 2. The MSQ film 2 is formed by, e.g., spin coating. It is then coated with the silicon oxide film 4 of silicon oxide, which works, e.g., to improve resistance to oxygen plasma ashing while the resist used in the subsequent step is separated, and to prevent dielectric constant from increasing in the presence of moisture. The wiring grooves are formed by dry etching in the MSQ film 2 and the silicon oxide film 4 to reach the silicon nitride film 1, after the silicon oxide film 4 is covered with the resist mask (not shown) (FIG. 6(c)).

Next, the entire surface is coated with the barrier metal film 5 by an adequate method, e.g., sputtering (FIG. 7(a)), and then with the copper film 6. The surface is then planarized by CMP, while leaving the copper film 6 in the wiring grooves, to complete the damascene wiring system (FIG. 7(b)).

In the semiconductor device prepared by the above procedure, since the space between the wires is filled with the MSQ film 2 with low dielectric constant, crosstalk can effectively be prevented. In this device, however, the silicon oxide film 4 tends to peel off from the organic MSQ film 2 on which it is formed in the subsequent step as shown in FIG. 5, because of insufficient adhesion between them at the interface, since the former is of an inorganic material while the latter of an organic material. The MSQ film 2 will have dielectric constant decreasing as its organic component content increases. On the other hand, the silicon oxide film 4 is preferably inorganic to have better characteristics, e.g., higher resistance to ashing. Therefore, they tend to be less compatible with each other, leading to peeling at the interface. The peeling causes lowered yield in the wiring step.

An attempt has been made to prevent the peeling by replacing the MSQ film 2 with a film containing no organic compound, such as that of Hydrogen Silsesquioxane (HSQ). However, the HSQ film has a higher dielectric constant than the MSQ film.

The other measures to prevent the peeling are to treat the MSQ film with ozone, UV-ozone or oxygen plasma, thereby improving its adhesion to the inorganic film. These methods, however, involve problems, e.g., penetration of water into the film, increased dielectric constant of the insulation film, and roughened film surface to leave residue. Therefore, the measures free of the above problems to improve adhesion have been demanded.

On the other hand, the planarizing process is becoming increasingly important for the interlayer insulation, while the fine machining techniques are required to meet the higher standards. Insufficient flatness will cause various problems, e.g., blurred exposure focus, difficulty in processing photoresist, and increased quantity of residual etchant during the etching process subsequent to masking with the photoresist. In order to make the interlayer insulation film flatter, a material with good reflow characteristics, e.g., BPSG (boron phosphate glass), has been used for the insulation film formed prior to the metal wiring process. The conventional process for forming a memory device or the like incorporating BPSG is described by referring to FIGS. 8 and 9.

Referring to FIG. 8(a), the gate electrode 60 which also serves as the word line is formed on the silicon semiconductor substrate. The processes through which such status is achieved will be described. First, the field insulation film 53 is formed by selective oxidation on the surface of the semiconductor substrate 51 composed of p-type single-crystal silicon. Then, the phosphorus ion is implanted to form the p-type well region 52. Then, the silicon oxide film 61 is formed by thermal oxidation, and coated with the polycrystalline silicon film 62, tungsten silicide (WSi) film 63 and silicon nitride film 64. These films are patterned by etching to form the gate electrode 60. Then, the silicon nitride film is formed and treated by anisotropic etching, to form the side-wall insulation film 65 of silicon nitride on the side of the gate electrode 60. Then, ion is implanted to form the impurity diffusion layer 54. These processes complete the assembly shown in FIG. 8(a).

Then, the BPSG film 55 is formed by CVD method. It is annealed with nitrogen to reflow, and etched back with buffered hydrogen fluoride (BHF), to planarize the BPSG film 55 surface (FIG. 8(b)).

The BPSG film 55 surface is covered with a patterned photoresist (not shown), and then subjected to dry etching with the photoresist serving as the mask, to form the contact hole 57 (FIG. 9(a)), during which the side-wall insulation film 65 works as the etching-stopping film for self-alignment of the contact hole 57. Then, the film is treated with buffered hydrofluoric acid to remove the natural oxide film on the impurity diffusion layer 54.

Then, the polycrystalline silicon film 72 is formed in such a way to fill the contact hole 57, and doped with phosphorus. The BPSG film is further coated with the tungsten silicide (WSi) film 73 and silicon oxide film 74, and etched to form the bit line (FIG. 9(b)).

Recently, the gap between the gate electrodes (word lines) has become very narrow at 0.2 μm or less, to satisfy the requirements for more integration, and the interlayer insulation film material is required to have better gap-filling characteristics. The required gap-filling characteristics become severer for highly integrating processes, such as those described above, which invariably need the so-called self-alignment techniques to secure insulation between the contact hole and wiring layer by the side-wall insulation film of the gate electrode. It is difficult for the conventional processes which use BPSG as the insulation film material to meet these requirements, and use of a material of better gap-filling characteristics is essential. The inorganic SOG films such as HSQ film and organic SOG films such as MSQ film are considered as the ones which can meet the above requirements. However, HSQ is low in resistance to chemical solutions, and difficult to form the contact hole of the shape as designed, because of side etching proceeding during the process of removing the natural oxide film with buffered hydrofluoric acid. The inorganic SOG films other than that of HSQ generally have a disadvantage of being easily cracked. As a result, the organic SOG films, e.g., MSQ film, have been most suitably used. The organic film with low dielectric constant, e.g., MSQ film, has good characteristics of filling a narrow gap, and can secure high flatness.

When an organic material of low dielectric constant, e.g., MSQ, is used, it is necessarily coated with an inorganic protective film, e.g., silicon oxide film, to have improved characteristics, e.g., resistance to ashing. This will cause the problem of peeling of the inorganic protective film from the MSQ film, as described earlier.

SUMMARY OF THE INVENTION

In consideration of the above-described problems, it is a purpose of the present invention to improve the interfacial adhesion between the film with low dielectric constant and protective film, without damaging the excellent dielectric, flatness and gap-filling characteristics of the organic material of low dielectric constant.

The present invention for solving the above-described problems may be specified by the following:

[1] A semiconductor device in which a multi-layered insulation film is formed on a semiconductor substrate and wires are formed in the multi-layered insulation film, characterized in that the multi-layered insulation film comprises a first insulation layer composed of an organic material of low dielectric constant which has a lower dielectric constant than silicon oxide, a second insulation layer composed of a polysiloxane compound having an Si—H group and formed on and being in contact with a top of the first insulation layer, and a third insulation layer composed of an inorganic material and formed on and being in contact with a top of the second insulation layer.

[2] The semiconductor device according to [1], wherein the first insulation layer is composed of an organopolysiloxane or aromatic-containing organic resin.

[3] The semiconductor device according to [1] or [2], wherein the second insulation layer is composed of hydrogen silsesquioxane and/or hydride organosiloxane.

[4] The semiconductor device according to any one of [1] to [3], wherein the third insulation layer is composed of one or more materials selected from the group consisting of silicon oxide, silicon nitride and silicon oxynitride.

[5] A semiconductor wafer with a multi-layered insulation film formed on one surface of the wafer, characterized in that the multi-layered insulation film comprises a first insulation layer composed of an organic material of low dielectric constant which has a lower dielectric constant than silicon oxide, a second insulation layer composed of a polysiloxane compound having an Si—H group and formed on and being in contact with a top of the first insulation layer, and a third insulation layer composed of an inorganic material and formed on and being in contact with a top of the second insulation layer.

[6] The semiconductor wafer according to [5], characterized in that the first insulation layer is composed of an organopolysiloxane or aromatic-containing organic resin.

[7] The semiconductor wafer according to [5] or [6], characterized in that the second insulation layer is composed of hydrogen silsesquioxane and/or hydride organosiloxane.

[8] The semiconductor wafer according to any one of [5] to [7], characterized in that the third insulation layer is composed of one or more materials selected from the group consisting of silicon oxide, silicon nitride and silicon oxynitride.

[9] A method of forming a multi-layered insulation film which forms, on a semiconductor wafer, the multi-layered insulation film containing a first insulation layer, a second insulation layer and a third insulation layer, characterized in that the method comprises the steps of forming the first insulation layer composed of an organic material having low dielectric constant which has a lower dielectric constant than silicon oxide, forming the second insulation layer composed of a polysiloxane compound having an Si—H group such that the second insulation layer is in contact with a top of the first insulation layer, and forming third insulation layer composed of an inorganic material such that the third insulation layer is in contact with a top of the second insulation layer.

[10] The method of forming a multi-layered insulation film according to [9], characterized in that the first insulation layer is composed of an organopolysiloxane or aromatic-containing organic resin.

[11] The method of forming a multi-layered insulation film according to [9] or [10], characterized in that the second insulation layer is composed of hydrogen silsesquioxane and/ or hydride organosiloxane.

[12] The method of forming a multi-layered insulation film according to any one of [9] to [11], characterized in that the third insulation layer is composed of one or more materials selected from the group consisting of silicon oxide, silicon nitride and silicon oxynitride.

[13] The method of forming a multi-layered insulation film according to any one of [9] to [12], characterized in that the first and second insulation layers are formed by the plasma CVD method without taking out said semiconductor wafer from the plasma atmosphere.

[14] The method of forming a multi-layered insulation film according to [13], characterized in that the feed gas for forming the first insulation layer is a mixed gas containing alkylsilane gas and oxidizing gas, and the feed gas for forming the second insulation layer is a mixed gas containing monosilane gas, alkylsilane gas and oxidizing gas.

[15] The method of forming a multi-layered insulation film according to any one of [9] to [12], characterized in that the semiconductor wafer is spin-coated with a solution containing the organic material of low dielectric constant and then thermally treated to form the first insulation layer, and the first insulation layer is thermally treated in atmosphere at 200° C. or more and 500° C. or less, inclusive, and coated with the second insulation layer by plasma CVD method.

[16] A method of producing a semiconductor device characterized in that the method comprises steps of forming a first insulation layer composed of an organic material of low dielectric constant which has a lower dielectric constant than silicon oxide, on a semiconductor substrate; forming a second insulation layer composed of a polysiloxane compound having an Si—H group such that the second insulation layer is in contact with a top of the first insulation layer; forming a third insulation layer composed of an inorganic material such that the third insulation layer is in contact with a top of the second insulation layer; etching the first, second and third insulation layers to form recesses therein; forming an electroconductive film over the entire surfaces of these recesses in such a way to fill them; and removing the electroconductive film formed on the region outside of each of these recesses by chemical mechanical polishing or etching.

[17] A method of producing a semiconductor device characterized in that the method comprises steps of forming, on a semiconductor substrate, a gate electrode with a side-wall insulation layer provided on its side, and a pair of impurity diffusion regions in the surface area of the semiconductor substrate on both sides of the gate electrode; forming a first insulation layer composed of an organic material of low dielectric constant which has a lower dielectric constant than silicon oxide, over the entire surface; forming a second insulation layer composed of a polysiloxane compound having an Si—H group such that the second insulation layer is in contact with a top of the first insulation layer; forming a third insulation layer composed of an inorganic material such that the third insulation layer is in contact with a top of the second insulation layer; etching the first, second and third insulation layers to form a contact hole, exposing the impurity diffusion regions to the bottom of the contact hole, and exposing the side-wall insulation layer to the side of the contact hole; and forming an electroconductive film over the entire surface in such a way to fill the contact hole.

[18] The method of producing a semiconductor device according to [16] or [17], characterized in that the first insulation layer is composed of an organopolysiloxane or aromatic-containing organic resin.

[19] The method of producing a semiconductor device according to any one of [16] to [18], characterized in that the second insulation layer is composed of hydrogen silsesquioxane and/or hydride organosiloxane.

[20] The method of producing a semiconductor device according to any one of [16] to [19], characterized in that the third insulation layer is composed of one or more materials selected from the group consisting of silicon oxide, silicon nitride and silicon oxynitride.

[21] The method of producing a semiconductor device according to any one of [16] to [20], characterized in that the first and second insulation layers are formed by the plasma CVD method without taking out said semiconductor wafer from the plasma atmosphere.

[22] The method of producing a semiconductor device according to [21], characterized in that the feed gas for forming the first insulation layer is a mixed gas containing alkylsilane gas and oxidizing gas, and the feed gas for forming the second insulation layer is a mixed gas containing monosilane gas, alkylsilane gas and oxidizing gas.

[23] The method of producing a semiconductor device according to any one of [16] to [20], characterized in that the semiconductor wafer is spin-coated with a solution containing the organic material of low dielectric constant and then thermally treated to form the first insulation layer, and the first insulation layer is thermally treated in atmosphere at 200° C. or more and 500° C. or less, inclusive, and coated with the second insulation layer by plasma CVD method.

The present invention described above, using an organic material of low dielectric constant for the first insulation layer, thus may prevent crosstalk between the wires, and suitably fill the narrow gap by the insulating film material. It has the second insulation layer, composed of a polysiloxane compound having an Si—H group, between the first and third insulation layers to improve the interlayer adhesion, efficiently preventing peeling of these layers from each other. These features improve process yield and provide the semiconductor device with high reliability.

The recess in the method [16] of the present invention may take any feature, including wiring groove or contact hole. In the method [17] of the present invention, the ion implanting for forming the impurity diffusion region is effected after the gate electrode patterns are formed, but may be effected either before or after the side-wall insulation film is formed.

Figure 1:
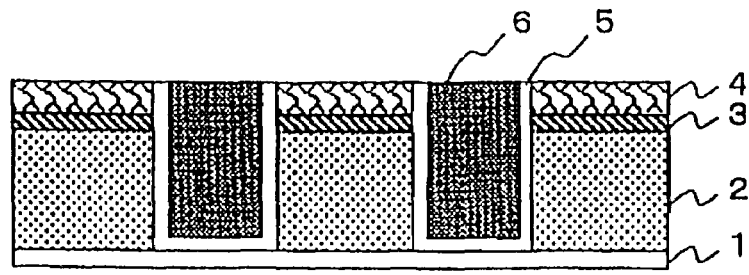
FIG. 1 shows one example of the semiconductor device of the present invention.

In these figures, 1 is a silicon nitride film, 2 is an MSQ film, 3 is an MHSQ film, 4 is a silicon oxide film, 5 is a barrier metal film, 6 is a copper film, 40 is a silicon substrate, 41 is an impurity diffusion film, 42 is a gate electrode, 43 is an interlayer connecting plug, 44 is a copper wiring system, 45 is an inter layer insulation film, 46 is a passivation film, 51 is a semiconductor substrate, 52 is a P-type well region, 53 is a field insulation film, 54 is an impurity diffusion film, 55 is a BPSG film, 57 is a contact hole, 60 is a gate electrode, 61 is a silicon oxide film, 62 is a polycrystalline silicon film, 63 is a WSi film, 64 is a silicon nitride film, 65 is a side-wall insulation film, 72 is a polycrystalline silicon film, 73 is a tungsten silicide film and 74 is a silicon oxide film.

DETAILED DESCRIPTION OF EXEMPLARY EMBODIMENTS

The first insulation layer for the present invention is composed of an organic material of low dielectric constant which has a lower dielectric constant than silicon oxide. It preferably has a relative dielectric constant of 3.5 or less, more preferably 3.0 or less, and is suitably composed of an organopolysiloxane or aromatic-containing organic resin.

The organopolysiloxane useful for the present invention is a polysiloxane having an organic functional group. An alkyl silsesquioxane and hydride alkyl siloxane are suitably used for their favorable dielectric characteristics and fabricability. The suitable compounds include methyl silsesquioxane having the repeating units shown by formulae (I) and (III), and methylated hydrogen silsesquioxane having the repeating units shown by formulae (I), (II) and (III) (hereinafter may be referred to as MHSQ). Of these, methyl silsesquioxane is more preferable for its dielectric characteristics and fabricability.

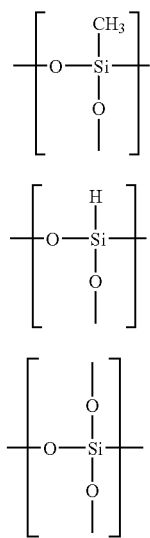

When MHSQ is used, the molar ratio of (I) to total of (I), (II) and (III) is preferably 0.5 or more, more preferably 0.7 or more. When the above ratio is excessively low, it may be difficult to have a sufficiently low dielectric constant and fabricability may be also damaged.

The aromatic-containing resins useful for the present invention include polyaryl ether (PAE) and divinyl siloxane-bis-benzocyclobutene (BCB). These compounds have a low dielectric constant and relatively good resistance to heat.

The second insulation layer for the present invention is composed of a polysiloxane compound having an Si—H group. Those polysiloxane compounds suitable for the present invention include hydrogen silsesquioxane having the repeating units shown by formulae (II) and (III), and MHSQ having the repeating units shown by formulae (I), (II) and (III). These polymers, having an Si—H group in the molecules, are highly adhesive to the first insulation layer composed of an organic compound of low dielectric constant and to the third layer composed of an inorganic material. The reasons for the excellent adhesion are not fully understood, but it is considered that the Si—H group is dehydrogenated to form the reactive sites, which react with the constituents of the first and third insulation layers.

When MHSQ is used, the molar ratio of (II) to total of (I), (II) and (III) is preferably 0.2 or more, more preferably 0.5 or more. Sufficient interlayer adhesion can be secured at the ratio in the above range.

The third insulation layer is provided for the present invention for enhancing resistance to ashing by oxygen plasma while the resist is removed and resistance to scratching during the planarizing process by CMP, and also for preventing increase in dielectric constant, which may be caused by absorbed moisture. The third insulation layer is preferably composed of one or more materials selected from the group consisting of silicon oxide, silicon nitride and silicon oxynitride.

The multi-layered insulation film for the present invention contains the first, second and third insulation layers, of which the first layer is preferably thicker than the others, because the present invention tries to effectively utilize the excellent dielectric, planarizing and gap-filling characteristics of the organic material of low constant as the constituent for the first insulation layer. The multi-layered insulation film for the present invention may have another layer of, e.g., MSQ, placed in the second insulation layer.

The first insulation layer for the present invention may be formed by, e.g., plasma CVD or spin coating. When plasma CVD is employed, the feed gas is a mixture of an alkylsilane gas and oxidizing gas. The alkylsilanes useful for the present invention include monomethylsilane, dimethylsilane, trimethylsilane and tetramethylsilane. They may be used either individually or in combination. Of these, trimethylsilane is more preferable.

The oxidizing gas means the gas having the effect of oxidizing the alkylsilane, and has an oxygen atom in the molecule. It may be one or more gases selected from the group consisting of NO, $NO_2$, CO, $CO_2$ and $O_2$. Of these, NO and $NO_2$ are suitably used for their adequate oxidizing power. When the first insulation layer is formed by spin coating, on the other hand, a solution dissolving the layer material is dropped onto a wafer rotating at a given speed, and thermally treated in two or more stages to be dried and solidified into the film that coats the wafer.

The second insulation layer for the present invention may be formed by, e.g., plasma CVD or spin coating, as is the case with the first insulation layer. Plasma CVD is more preferable, when the layer is to be more adhesive.

When plasma CVD method is employed, the feed gas is a mixture of monosilane ($SiH_4$) gas, an alkylsilane gas and oxidizing gas. The alkylsilanes useful for the present invention include monomethylsilane, dimethylsilane, trimethylsilane and tetramethylsilane. They may be used either individually or in combination. Of these, trimethylsilane is more preferable. The oxidizing gas means the gas having the effect of oxidizing the alkylsilane, and has an oxygen atom in the molecule. It may be one or more gases selected from the group consisting of NO, $NO_2$, CO, $CO_2$ and $O_2$. Of these, NO and $NO_2$ are suitably used for their adequate oxidizing power.

When the first insulation layer is formed by spin coating method, on the other hand, a solution dissolving the layer material is dropped onto a wafer rotating at a given speed, and thermally treated in two or more stages to be dried and solidified into the film that coats the wafer.

The third insulation layer for the present invention may be formed by thermal or plasma CVD method. The feed gas may be a mixture of monosilane ($SiH_4$) and an oxidizing gas, or tetraethoxysilane (TEOS), among others.

It is preferable to form the first and second insulation layers by the following method (i) or (ii) for the present invention.
 (i) Plasma CVD is employed to form the first and second insulation layers without taking out the semiconductor wafer from the plasma atmosphere.
 (ii) A solution containing the organic material of low dielectric constant is spread over the semiconductor wafer by spin coating, and then thermally treated to form the first insulation layer. Then, it is thermally treated at 200° C. or more and 500° C. or less, preferably 350° C. or more and 500° C. or less, before the second insulation layer is provided thereon.

In the method (i), the semiconductor wafer is not taken out from the plasma atmosphere, and hence the Si—H group contained in the second insulation layer is prevented from deteriorating in reactivity. At the same time, the second insulating layer formed is prevented from absorbing moisture, keeping itself particularly adhesive to the other layer.

Figure 8:
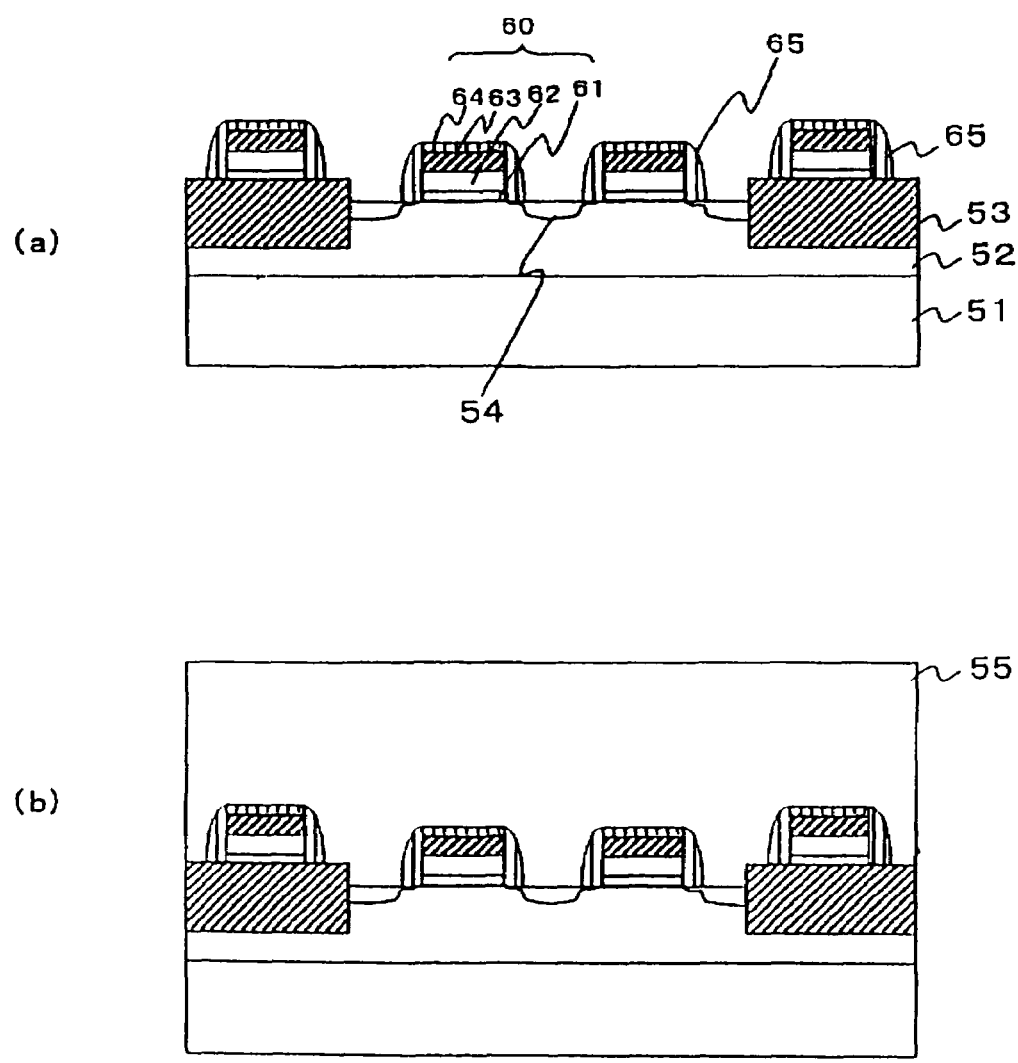
FIGS. 8a-8b show still another example of the conventional method for producing a semiconductor device.
Figure 9:
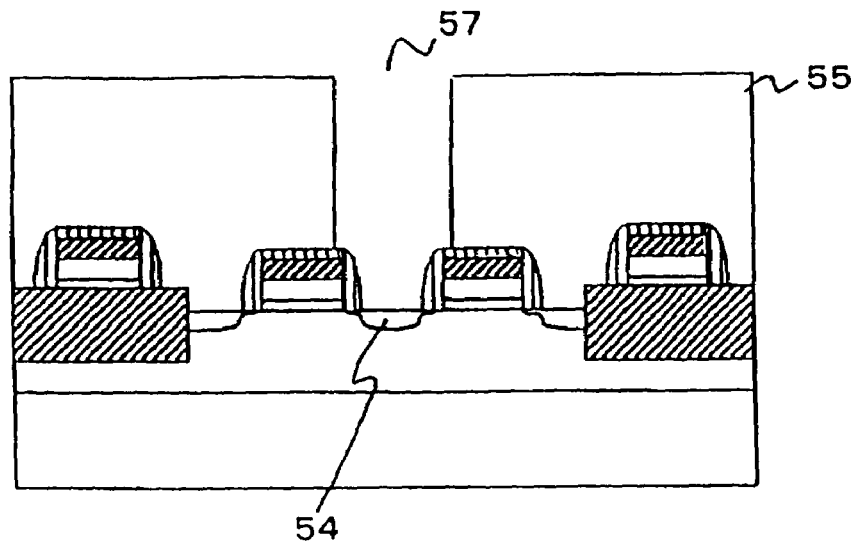
FIGS. 9a-9b show still another example of the conventional method for producing a semiconductor device.
Figure 9:
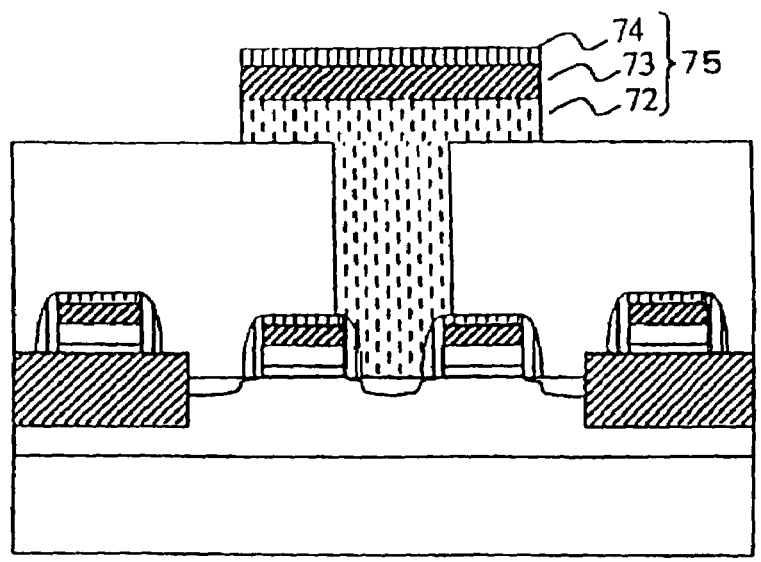

In the method (ii), the first insulation layer is formed by spin coating which can securely form the insulation material in a narrow space between the gaps. It is therefore suitably applicable to the process of forming the interlayer insulation film on the gate electrode, described in the Prior Art (FIG. 8). This method thermally treats the first insulation layer at a given temperature after it is formed, to make it more adhesive to the second insulation layer. The reasons for improved adhesion are not fully understood, but it is considered that the reactions between the constituents of the first and second layers proceed more smoothly as a result of evaporation of moisture or the like adsorbed on the surface of the first insulation layer and increased reactivity of the first insulation layer surface. The thermal treatment is preferably effected under a vacuum, e.g., 1 to 100 Pa, normally for 1 to 10 minutes.

In the present invention, the term "wire" generically means anything that electrically connects devices, e.g., transistors, to each other, including word line which also serves as a gate electrode in a memory element. The present invention is particularly effective, when applied to the damascene wiring structure with an electroconductive film filled in a plurality of recesses provided in a multi-layered insulation film and other structures with a self-aligned contact on a gate electrode.

EXAMPLE 1

Example 1 describes one example of process flow for producing the semiconductor device with a multi-layered wiring structure with damascene copper wires.

Figure 4:
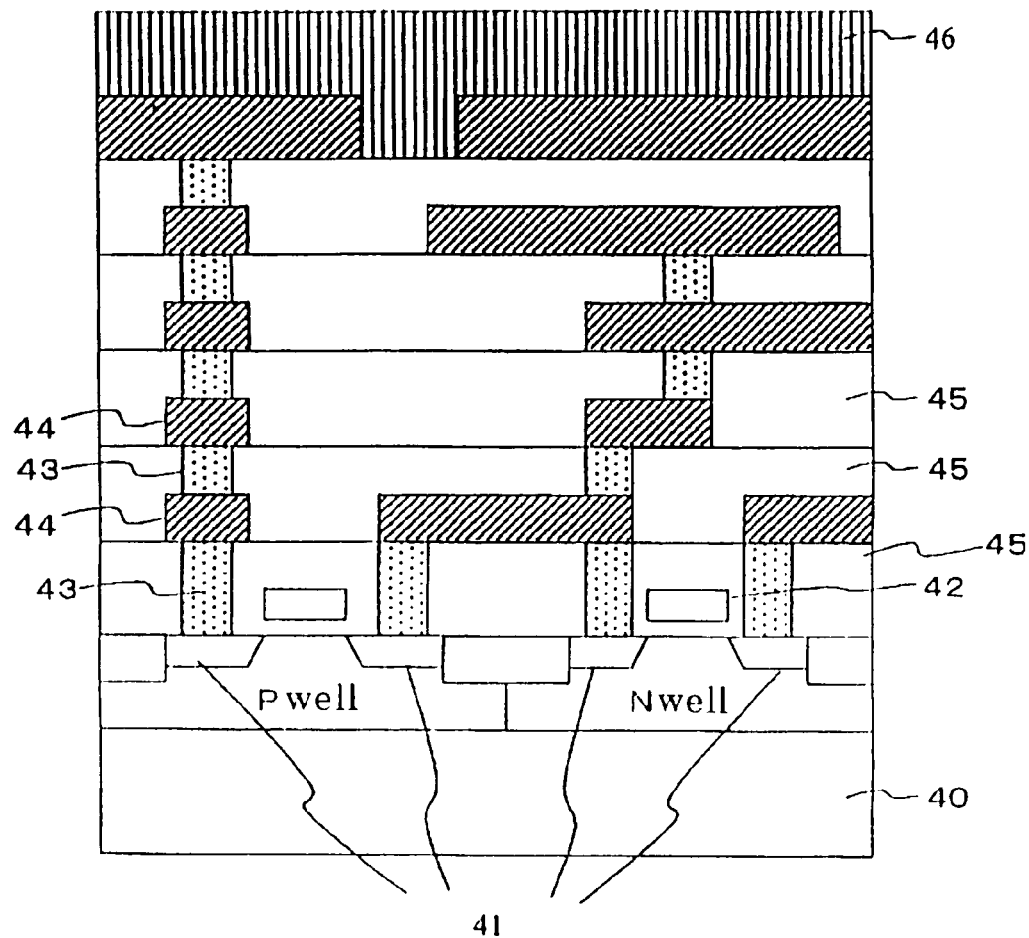
FIG. 4 show a multi-layered wiring structure.
Figure 5:
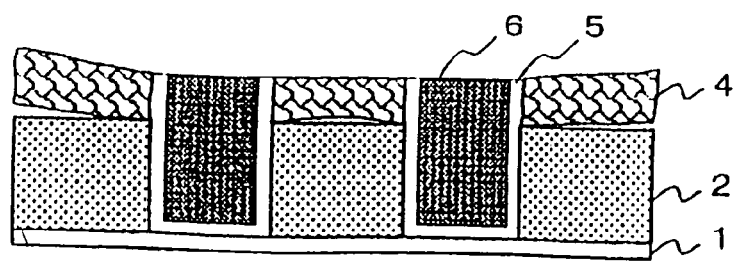
FIG. 5 show one example of the conventional semiconductor device.
Figure 6:
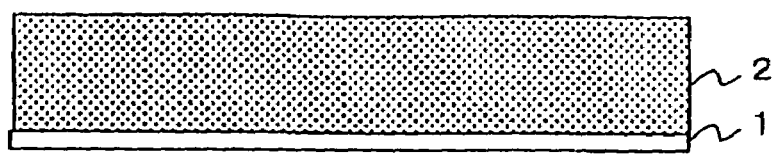
FIGS. 6a-6c show one example of the conventional method for producing a semiconductor device.
Figure 6:
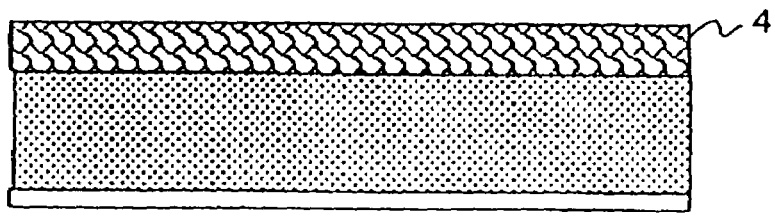
Figure 6:
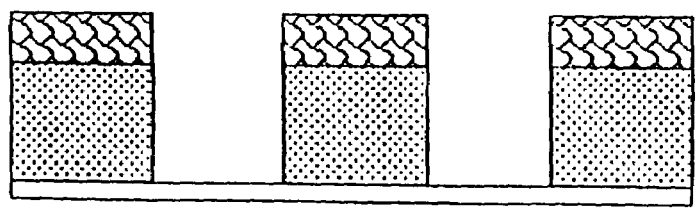
Figure 7:
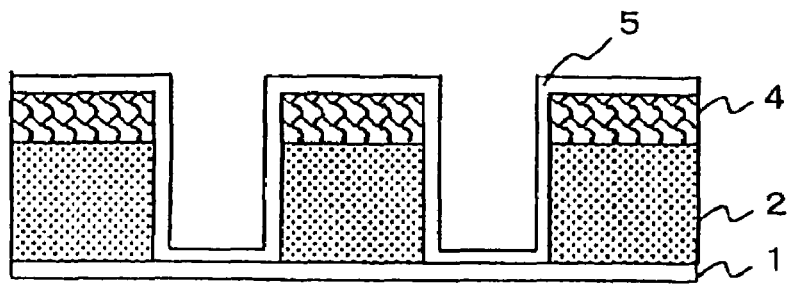
FIGS. 7a-7b show another example of the conventional method for producing a semiconductor device.
Figure 7:
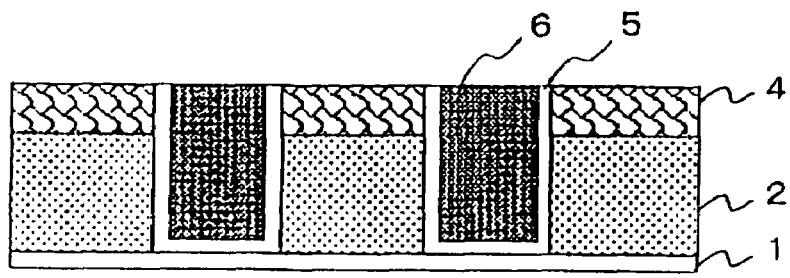

In a logic device or the like, a multi-layered wiring structure with a plurality of wiring layers, such as the one shown in FIG. 4, is frequently used. It comprises the silicon substrate 40 which supports the transistor composed of the gate electrode 42 and impurity diffusion layer 41 in the first layer (device-forming layer), and two or more interlayer insulation films 45 containing copper wires 44, connected to each other by interlayer connecting plugs 43.

This example adopts the wiring layer shown in detail in FIG. 1 as the component of the multi-layered wiring system. The wiring structure shown in FIG. 1 comprises the silicon nitride film 1, methyl silsesquioxane (MSQ) film 2, methylated hydrogen silsesquioxane (MHSQ) film 3 and silicon oxide film 4, formed in this order. The multi-layered insulation film has two or more wiring grooves, filled with the copper film 6 via the barrier metal film 5 of Ta therein. The copper film 6 is approximately 200 to 500 nm thick.

Figure 2:
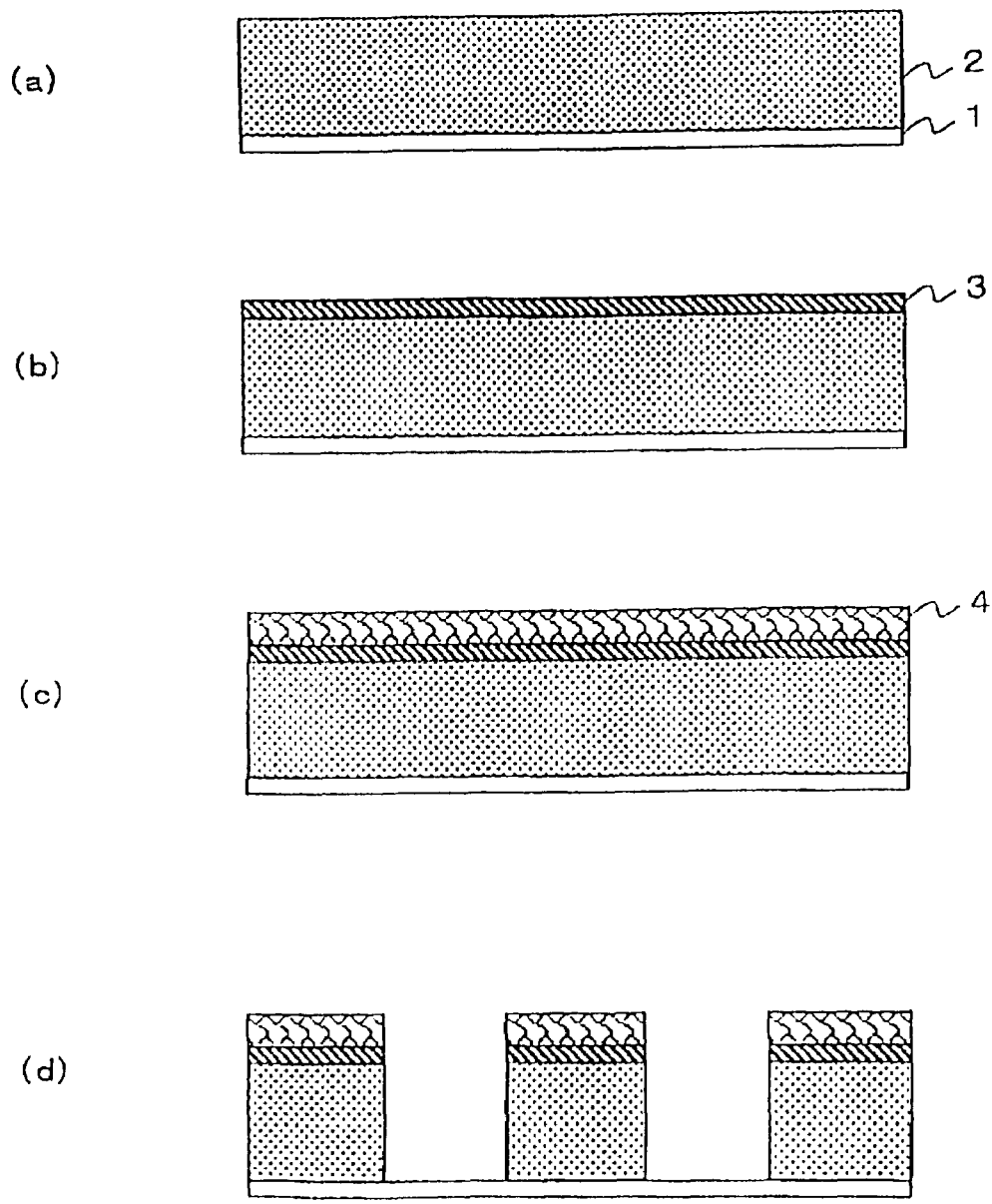
FIGS. 2a-2d show one example of the method of the present invention for producing a semiconductor device.

The process for forming the wiring structure shown in FIG. 1 is described by referring to the drawings. Referring to FIG. 2(*a*), the silicon nitride film 1 (thickness: 50 nm) was formed on the lower wiring layer (not shown) by plasma CVD, and then was coated with the MSQ film 2 (thickness: 250 nm). The feed gas for forming the MSQ film 2 was a mixture of trimethylsilane and N$_2$O. The MSQ film 2 had a structure with the repeating units shown by the formulae (I) and (III).

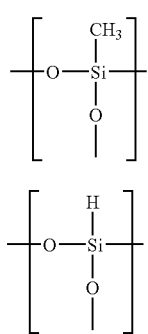

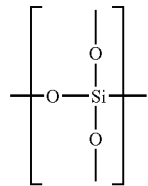

The MSQ film 2, after its deposition, was then coated with the MHSQ film 3 (thickness: 50 nm) by plasma CVD (FIG. 2(*b*)). The feed gas was a mixture of monosilane (SiH$_4$), trimethylsilane and N$_2$O. The MHSQ film 3 had a structure with the repeating units shown by the formulae (I), (II) and (III) above. The molar ratio of (II) to total of (I), (II) and (III) is 0.5 to 0.6 from the feed gas composition.

The MHSQ film 3 was then coated with the silicon oxide film 4 (thickness: 100 nm) by plasma CVD or the like (FIG. 2(*c*)). The feed gas was a mixture of monosilane (SiH$_4$) and N$_2$O.

Thus, the multi-layered film with the laminated MSQ film 2, MHSQ film 3 and silicon oxide film 4 was prepared in a series of steps by changing the feed gas for each film, without taking out the wafer from the plasma atmosphere in the plasma system. The multi-layered film was then dry-etched to have wiring grooves reaching the silicon nitride film 1 (FIG. 2(*d*)).

Figure 3:
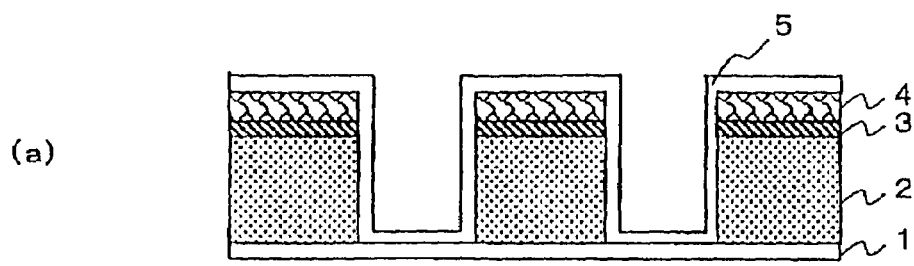
FIGS. 3a-3b show another example of the method of the present invention for producing a semiconductor device.
Figure 3:
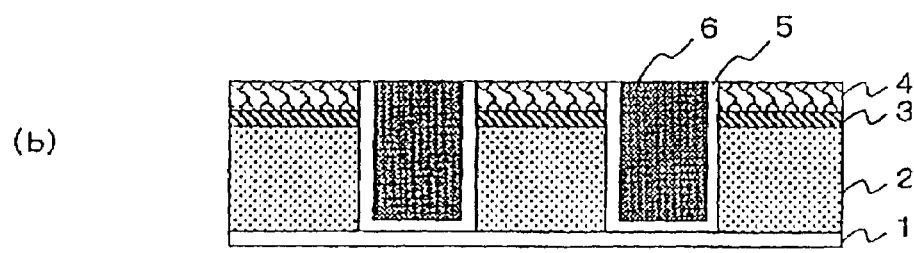

Each of the wiring grooves was coated with the barrier metal film 5 of Ta over the entire surface by sputtering (FIG. 3(*a*)) and then with the copper layer 6 also over the entire surface by plating (FIG. 3(*b*)). The copper film 6 may be formed by, e.g., CVD or sputtering, but preferably by plating or CVD for good coverage it gives. On completion of formation of the copper film 6, the entire surface was planarized by CMP, to prepare the damascene wiring system while leaving the copper film 6 in each of the wiring grooves.

The semiconductor device prepared by the above process had few problems related to crosstalk because the space between the wires was filled with the MSQ film 2 of low dielectric constant, and showed good interlayer adhesion because the MHSQ film 3 was placed between the MSQ film 2 and silicon oxide film 4.

EXAMPLE 2

Figure 10:
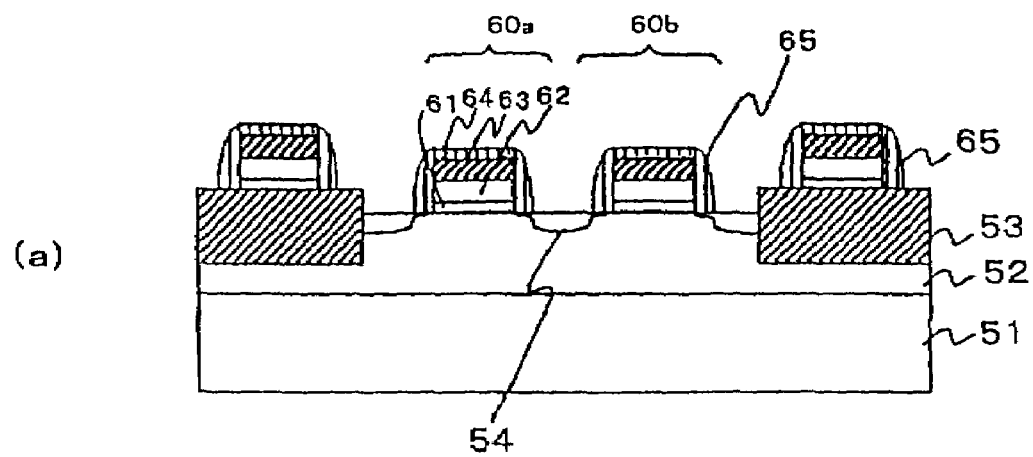
FIGS. 10a-10c show still another example of the method of the present invention for producing a semiconductor device.
Figure 10:
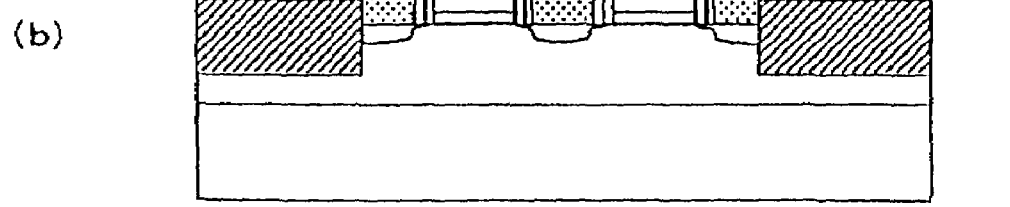
Figure 10:
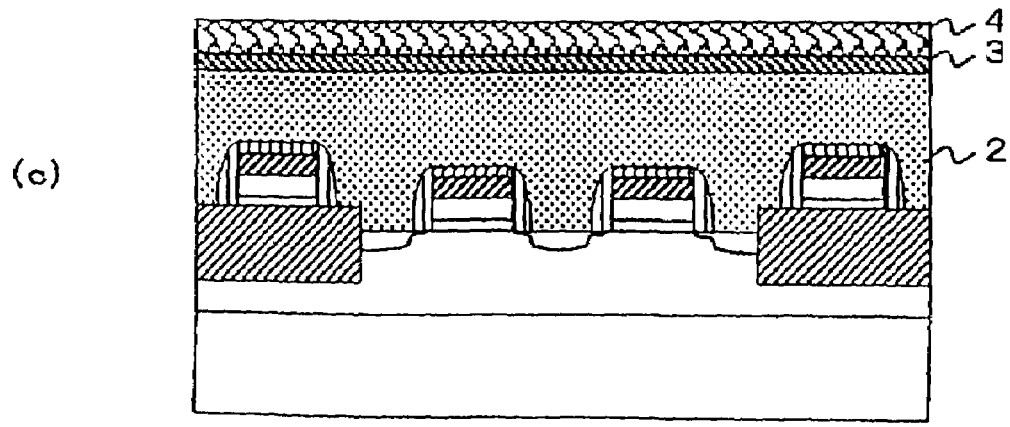

The gate electrode 60 also serving as the word line was formed on the silicon semiconductor substrate, as shown in FIG. 10(*a*). The process for forming the above assembly is described. First, the field insulation film 53 was formed by selective oxidation on the surface of the semiconductor substrate 51 composed of p-type single-crystal silicon. Then, the phosphorus ion was implanted to form the p-type well region 52. Then, the silicon oxide film 61 was formed by thermal oxidation, and coated with the polycrystalline silicon film 62, tungsten silicide (WSi) film 63 and silicon oxide film. These films were patterned by etching to form the gate electrode 60. Then, the silicon nitride film was formed and treated by anisotropic etching, to form the side-wall insulation film 65 of silicon nitride on the side of the gate electrode 60. Then, ion was implanted to form the impurity diffusion layer 54. These processes complete the assembly shown in FIG. 10(*a*).

Then, the MSQ film 2 (thickness: 300 nm) was formed by spin coating. More concretely, the methyl silsesquioxane solution was dropped onto a rotating wafer provided with the gate electrode patterns. The spin-coated wafer was cured stepwise at 80°, 100° and 120° C., to dry the solvent and solidify the methyl silsesquioxane, and thereby to prepare the MSQ film 2. MSQ has sufficiently good characteristics to fill a narrow gap, and can form the insulation film even in the region provided with the gate electrode patterns at narrow intervals, as shown in FIG. 10(*b*).

The wafer treated to have the MSQ film 2 was placed in a film-making device, where it was allowed to stand at 450° C. for around 10 minutes. It was then coated with the MHSQ film 3 (thickness: 50 nm) and silicon oxide film 4 (thickness: 100 nm) by plasma CVD (FIG. 10(*c*)). The multi-layered structure was prepared in a series of steps by changing the feed gas for each film, without taking out the wafer from the plasma atmosphere in the plasma device. The feed gas for forming the MHSQ film 3 was a mixture of monosilane ($SiH_4$), trimethylsilane and $N_2O$, and that for forming the silicon oxide film 4 was a mixture of monosilane ($SiH_4$) and $N_2O$. The molar ratio of the repeating unit (II) to total of the repeating units (I), (II) and (III) was 0.5 to 0.6 from the feed gas composition.

The multi-layered film with the MSQ film 2, MHSQ film 3 and silicon oxide film 4 was covered with a patterned photoresist (not shown), and the MSQ film 2, MHSQ film 3 and silicon oxide film 4 were subjected to dry etching with the photoresist serving as the mask, to form the contact hole 57, during which the side-wall insulation film 65 worked as the etching-stopping film for self-alignment of the contact hole 57. Then, the film was treated with buffered hydrofluoric acid to remove the natural oxide film on the impurity diffusion layer 54.

Figure 11:
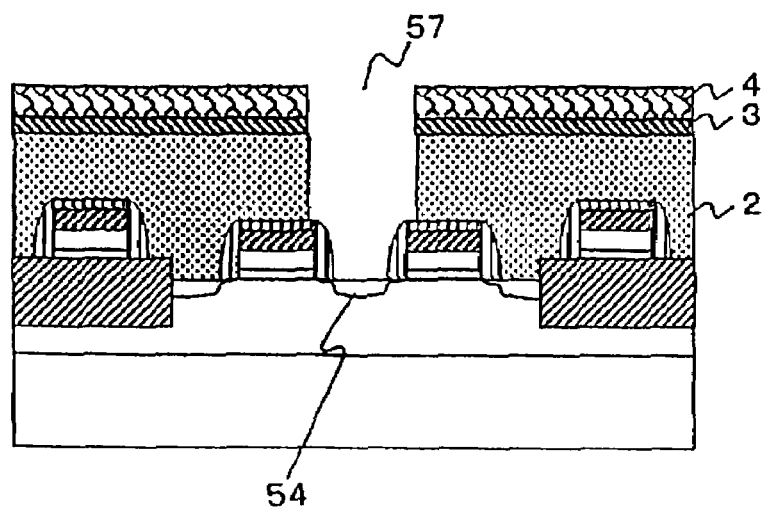
FIGS. 11a-11b show still another example of the method of the present invention for producing a semiconductor device.
Figure 11:
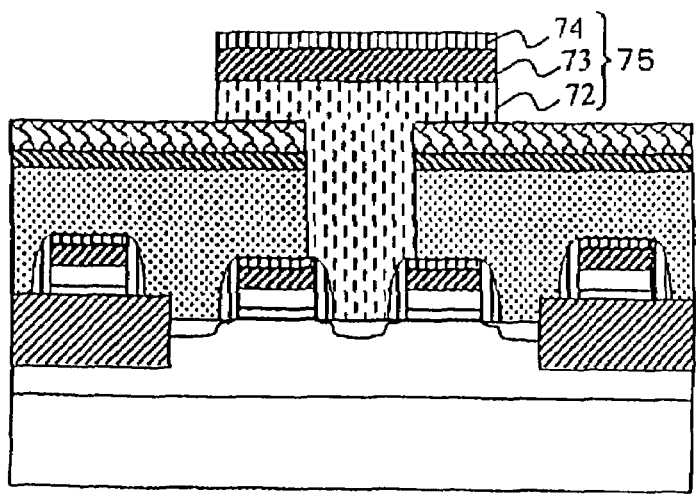

The polycrystalline silicon film 72 was formed in such a way to fill the contact hole 57, and the phosphorus ion was implanted. Then, the tungsten silicide (WSi) film 73 and silicon oxide film 74 were deposited by DC magnetron sputtering method. Then, the polycrystalline silicon film 72, the tungsten silicide (WSi) film 73 and silicon oxide film 74 are etched by RIE to form the bit line (FIG. 11(*b*))

The semiconductor device prepared by the above process had good gap-filling characteristics because MSQ of good gap-filling and flatness characteristics as a interlayer insulation film, and showed good interlayer adhesion because the MHSQ film 3 was placed between the MSQ film 2 and silicon oxide film 4.

As described above, the present invention may use an organic material of low dielectric constant for the first insulation layer to prevent crosstalk between the wires, and suitably fill the narrow gap by the insulating film material. It has the second insulation layer, composed of a polysiloxane compound having an Si—H group, between the first and third insulation layers to improve the interlayer adhesion, efficiently preventing peeling of these layers from each other.

What is claimed is:

1. A method of forming a multi-layered insulation film on a semiconductor wafer, comprising:
    forming by a plasma CVD method a methyl silsesquioxane (MSQ) layer using a first feed gas;
    forming a methylated hydrogen silsesquioxane (MHSQ) layer using a second feed gas, such that the methylated hydrogen silsesquioxane (MHSQ) layer is in contact with a top of the methyl silsesquioxane (MSQ) layer; and
    forming an inorganic insulation layer such that the inorganic insulation layer is in contact with a top of the methylated hydrogen silsesquioxane (MHSQ) layer,
    wherein said methylated hydrogen silsesquioxane (MHSQ) layer is highly adhesive,
    wherein said methylated hydrogen silsesquioxane (MHSQ) layer is formed by a plasma CVD method, said semiconductor wafer being maintained in a plasma atmosphere between said forming said methyl silsesquioxane (MSQ) layer and forming said methylated hydrogen silsesquioxane (MHSQ) layer,
    wherein said first feed gas comprises a mixed gas of alkylsilane gas and oxidizing gas, and
    wherein said second feed gas comprises a mixed gas of monosilane gas, alkylsilane gas and oxidizing gas.

2. The method of forming a multi-layered methyl silsesquioxane (MSQ) insulation layer on a semiconductor wafer according to claim 1, forming said methylated hydrogen silsesquioxane (MHSQ) layer and forming said inorganic insulation layer are performed by changing a feed gas composition without removing said semiconductor wafer from said plasma atmosphere.

3. The method of forming a multi-layered insulation film on a semiconductor wafer according to claim 1, wherein said maintaining said semiconductor wafer in said plasma atmosphere maintains a reactivity of an Si—H group in said methylated hydrogen silsesquioxane (MHSQ) layer and inhibits said methylated hydrogen silsesquioxane (MHSQ) layer from absorbing moisture.

4. The method of forming a multi-layered insulation film on a semiconductor wafer according to claim 1, wherein said oxidizing gas in said first feed gas and said second feed gas comprises at least one of NO, $NO_2$, CO, $CO_2$ and $O_2$.

5. The method of forming a multi-layered insulation film on a semiconductor wafer according to claim 1, wherein said forming said inorganic insulation layer comprises forming said inorganic insulation layer by plasma CVD.

6. The method of forming a multi-layered insulation film on a semiconductor wafer according to claim 1, wherein said methyl silsequioxane (MSQ) layer has a thickness which is greater than a thickness of said methylated hydrogen silsesquioxane (MHSQ) layer and greater than a thickness of said inorganic insulation layer.

7. The method of forming a multi-layered insulation film on a semiconductor wafer according to claim 6, further comprising:
    forming a patterned photoresist on said inorganic insulation layer;
    etching said MSQ layer, said MHSQ layer and said inorganic insulation layer by using said patterned photoresist, to form a contact hole in said MSQ layer, said MHSQ layer and said inorganic insulation layer;
    removing said patterned photoresist by using an oxygen plasma;
    forming a copper film in said contact hole; and
    planarizing a surface of said copper film and a surface of said inorganic insulation layer by performing chemical mechanical polishing (CMP).

8. The method of forming a multi-layered insulation film on a semiconductor wafer according to claim 6, wherein said contact hole comprises a plurality of contact holes formed in said MSQ layer, said MHSQ layer and said inorganic insulation layer, and
    wherein said copper film comprises a plurality of wires formed in said plurality of contact holes, such that said MSQ layer, MHSQ layer and inorganic insulation layer of said multi-layered insulation film fill a space between said wires, a thickness of said plurality of wires in said grooves being in a range from 200 nm to 500 nm, and
    wherein said planarizing a surface of said copper film and a surface of said inorganic insulation layer comprises planarizing a surface of said inorganic insulation layer and a surface of said plurality of wires, said MHSQ layer inhibiting a peeling away of said inorganic insulation layer during said planarization of said surface of said inorganic insulation layer and said plurality of wires.

9. A method of producing a semiconductor device, comprising:
forming, on a semiconductor substrate, a gate electrode with a side-wall insulation layer provided on a side, and a pair of impurity diffusion regions in a surface area of the semiconductor substrate on both sides of the gate electrode;
forming a methyl silsesquioxane (MSQ) layer over an entire surface of said substrate;
forming a methylated hydrogen silsesquioxane (MHSQ) layer which contacts a top of said methyl silsesquioxane (MSQ) layer;
forming an inorganic insulation layer where the inorganic insulation layer contacts a top of said methylated hydrogen silsesquioxane (MHSQ) layer;
after said forming said inorganic insulation layer, etching said MSQ layer, MHSQ layer, and inorganic layer to form a contact hole;
exposing said impurity diffusion regions to a bottom of said contact hole;
exposing said side-wall insulation layer to a side of said contact hole; and
forming an electroconductive film over the entire surface to fill said contact hole,
wherein said methylated hydrogen silsesquioxane (MHSQ) layer is highly adhesive,
wherein a dielectric constant of said methyl silsesquioxane (MSQ) layer is 3.0 or less, and
wherein said forming said methyl silsesquioxane (MSQ) layer and said forming said methylated hydrogen silsesquioxane (MHSQ) layer comprise using plasma chemical vapor deposition (CVD), said device being maintained in a plasma atmosphere between said forming said methyl silsesquioxane (MSQ) layer and said forming said methylated hydrogen silsesquioxane (MHSQ) layer.

10. The method of producing a semiconductor device according to claim 9, wherein said alkylsilane in said first feed gas and said second feed gas comprises at least one of dimethylsilane, trimethylsilane and tetramethylsilane.

11. The method according to claim 9, wherein said inorganic layer comprises at least one of silicon oxide, silicon nitride and silicon oxynitride.

12. The method according to claim 9, wherein said methylated hydrogen silsesquioxane (MHSQ) layer includes repeating units shown by formulae I, II and III

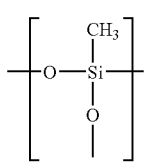
(I)

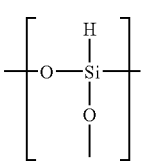
(II)

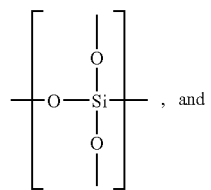
(III)

and
wherein a molar ratio of II to a total of I, II and III is at least 0.2.

13. The method according to claim 12, wherein said molar ratio of II to a total of I, II and III is at least 0.5.

14. The method of forming a semiconductor device according to claim 9, wherein said device is maintained in said plasma atmosphere during an entire period between said forming said methyl silsesquioxane (MSQ) layer and said forming said methylated hydrogen silsesquioxane (MHSQ) second insulation layer.

15. The method of producing a semiconductor device according to claim 9, wherein forming said gate electrode comprises forming a plurality of gate electrodes having a side-wall insulation layer provided on a side, and a pair of impurity diffusion regions in a surface area of the semiconductor substrate on sides of the gate electrodes, said contact hole being formed between said plurality of gate electrodes,
wherein said forming said methyl silsesquioxane (MSQ) layer comprises forming said methyl silsesquioxane (MSQ) layer on said plurality of gate electrodes,
wherein said forming said methylated hydrogen silsesquioxane (MHSQ) layer comprises forming said methylated hydrogen silsesquioxane (MHSQ) layer on said plurality of gate electrodes, and
wherein said forming said inorganic insulation layer comprises forming said inorganic insulation layer on said plurality of gate electrodes.

16. A method of producing a semiconductor device, comprising:
forming a methyl silsesquioxane (MSQ) layer using a first feed gas, on a semiconductor substrate;
forming a methylated hydrogen silsesquioxane (MHSQ) layer using a second feed gas, where the methylated hydrogen silsesquioxane (MHSQ) layer contacts a top of said methyl silsesquioxane (MSQ) layer;
forming an inorganic insulation layer where the third insulation layer contacts a top of said methylated hydrogen silsesquioxane (MHSQ) layer;
etching said MSQ layer, MHSQ layer and inorganic layer to form recesses therein;
forming an electroconductive film over said recesses in order to fill said recesses; and
removing said electroconductive film formed on the region outside of each of said recesses by at least one of chemical mechanical polishing and etching,
wherein said methylated hydrogen silsesquioxane (MHSQ) layer is highly adhesive,
wherein a dielectric constant of said methyl silsesquioxane (MSQ) layer is 3.0 or less,
wherein said MSQ layer and MHSQ layer are formed by a plasma CVD method, said device being maintained in a plasma atmosphere between said forming said methyl silsesquioxane (MSQ) layer and forming said methylated hydrogen silsesquioxane (MHSQ) layer, wherein said first feed gas comprises a mixed gas comprising an alkylsilane gas and an oxidizing gas, and wherein said second feed gas comprises a mixed gas comprising a monosilane gas, an alkylsilane gas and an oxidizing gas.

17. A method of forming a multi-layered insulation film on a semiconductor wafer, comprising:

forming by a plasma CVD method a methyl silsesquioxane (MSQ) layer;

forming a methylated hydrogen silsesquioxane (MHSQ) layer where the methylated hydrogen silsesquioxane (MHSQ) layer contacts a top of the methyl silsesquioxane (MSQ) layer;

forming an inorganic insulation layer where the inorganic insulation layer contacts a top of the methylated hydrogen silsesquioxane (MHSQ) layer; and after said forming said inorganic insulation layer, forming a plurality of grooves in said MSQ layer, MHSQ layer and inorganic layer, and wherein said forming said methylated hydrogen silsesquioxane (MHSQ) layer comprises using a plasma chemical vapor deposition (CVD), said device being maintained in a plasma atmosphere between said forming said methyl silsesquioxane (MSQ) layer and said forming said methylated hydrogen silsesquioxane (MHSQ) layer.

18. The method according to claim 17, wherein said semiconductor wafer is maintained in a plasma atmosphere during an entire period between said forming said methyl silsesquioxane (MSQ) layer and said forming said methylated hydrogen silsesquioxane (MHSQ) layer.

* * * * *